(12) United States Patent
Cai et al.

(10) Patent No.: US 10,290,715 B2
(45) Date of Patent: May 14, 2019

(54) SEMICONDUCTOR DEVICE AND METHOD FOR MANUFACTURING THE SAME

(71) Applicant: Silergy Semiconductor Technology (Hangzhou) LTD, Hangzhou, ZheJiang Province (CN)

(72) Inventors: Jinyong Cai, Hangzhou (CN); Zhongping Liao, Hangzhou (CN)

(73) Assignee: Silergy Semiconductor Technology (Hangzhou) LTD, Hangzhou (CN)

(*) Notice: Subject to any disclaimer, the term of this patent is extended or adjusted under 35 U.S.C. 154(b) by 0 days.

(21) Appl. No.: 15/871,296

(22) Filed: Jan. 15, 2018

(65) Prior Publication Data

US 2018/0212027 A1    Jul. 26, 2018

(30) Foreign Application Priority Data

Jan. 23, 2017    (CN) .......................... 2017 1 0049015

(51) Int. Cl.

| H01L 29/40 | (2006.01) |
|---|---|
| H01L 29/78 | (2006.01) |
| H01L 21/28 | (2006.01) |
| H01L 29/423 | (2006.01) |
| H01L 29/417 | (2006.01) |

(52) U.S. Cl.
CPC ...... H01L 29/404 (2013.01); H01L 21/28273 (2013.01); H01L 29/407 (2013.01); H01L 29/4236 (2013.01); H01L 29/7813 (2013.01); *H01L 29/41741* (2013.01)

(58) Field of Classification Search
CPC .............. H01L 29/404; H01L 29/407; H01L 29/66734; H01L 29/7813
See application file for complete search history.

(56) References Cited

U.S. PATENT DOCUMENTS

| 9,018,062 B2 | 4/2015 | Liao |
| 9,245,977 B2 | 1/2016 | Liao |
| 9,299,830 B1* | 3/2016 | Kawahara ............. H01L 29/063 |
| 9,525,059 B1* | 12/2016 | Kobayashi .......... H01L 29/7813 |
| 2003/0148559 A1 | 8/2003 | Onishi et al. |
| 2007/0075363 A1 | 4/2007 | Otake et al. |
| 2007/0114600 A1* | 5/2007 | Hirler ................... H01L 29/407 257/330 |
| 2009/0166728 A1* | 7/2009 | Pan ..................... H01L 29/0623 257/330 |

(Continued)

*Primary Examiner* — Bryan R Junge
(74) *Attorney, Agent, or Firm* — Michael C. Stevens, Jr.

(57) ABSTRACT

A semiconductor device can include: a substrate having a semiconductor material; a plurality of semiconductor layers of a first conductivity type, and being sequentially stacked on the substrate, where a doping concentration of the semiconductor layers successively increases from bottom to top; a trench that extends from the surface of a topmost semiconductor layer into a bottommost semiconductor layer of the semiconductor layers; a plurality of field plates that correspond to the semiconductor layers, each field plate being located in a portion of the trench that corresponds to one of the semiconductor layers; and a trench pad located in a bottom and a sidewall of the trench, and being filled each space between two adjacent field plates, where the thickness of the trench pad between each field plate and corresponding semiconductor layer sequentially decreases from the bottom to the top.

13 Claims, 11 Drawing Sheets

(56) References Cited

U.S. PATENT DOCUMENTS

| | | | |
|---|---|---|---|
| 2011/0133272 A1* | 6/2011 | Mauder | H01L 29/407 257/335 |
| 2012/0043602 A1* | 2/2012 | Zeng | H01L 29/0623 257/330 |
| 2012/0241849 A1* | 9/2012 | Nozu | H01L 29/404 257/330 |
| 2013/0153995 A1* | 6/2013 | Misawa | H01L 29/407 257/330 |
| 2014/0015039 A1* | 1/2014 | Hossain | H01L 29/36 257/330 |
| 2015/0076600 A1 | 3/2015 | Jun et al. | |
| 2015/0295080 A1* | 10/2015 | Lee | H01L 29/7813 257/330 |
| 2016/0064478 A1 | 3/2016 | Sun et al. | |
| 2016/0093719 A1* | 3/2016 | Kobayashi | H01L 21/28008 257/330 |
| 2017/0012118 A1* | 1/2017 | Park | H01L 29/7802 |
| 2017/0309610 A1 | 10/2017 | Yao et al. | |

* cited by examiner

FIG. 1 (conventional)

SEMICONDUCTOR DEVICE AND METHOD FOR MANUFACTURING THE SAME

RELATED APPLICATIONS

This application claims the benefit of Chinese Patent Application No. 201710049015.0, filed on Jan. 23, 2017, which is incorporated herein by reference in its entirety.

FIELD OF THE INVENTION

The present invention generally relates to semiconductor devices and associated manufacturing methods.

BACKGROUND

Figure 1:
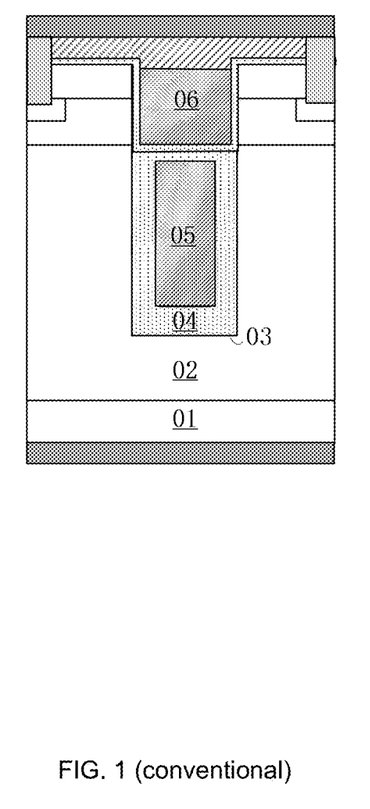
FIG. 1 is a cross-sectional diagram of a conventional split-gate trench MOSFET.

FIG. 1 is a cross-sectional diagram of a conventional split-gate trench MOSFET. This example can include substrate 01, epitaxial layer 02 on substrate 01, trench 03 in epitaxial layer 02, trench pad 04 in trench 03, and field plate 05 and gate 06 located in trench 03 and being separated from epitaxial layer 02 by trench pad 04. In addition, the split-gate trench MOSFET can include a body region, a source region, and a source electrode, and field plate 05 can be coupled with the source electrode. Due to the presence of the field plate at the bottom of trench 03, this kind of split-gate trench MOSFET may increase the depletion of epitaxial layer 02 to optimize the electric field distribution of the device, thereby reducing the on-resistance of the device while simultaneously ensuring the breakdown voltage.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

The split-gate trench MOSFET shown in FIG. 1 may only be suitable for relatively low voltage applications. For relatively high voltage applications (e.g., with breakdown voltages (BV) higher than about 100V), the depth of trench 03 can be increased. Also, the coupling effect between the electric field peak at the body region and epitaxial layer 02 and the electric field peak at the bottom of trench 03 may be weakened. In order to increase the breakdown voltage, the doping concentration of epitaxial layer 02 may be significantly reduced. However, this can cause a significant increase in the on-resistance, and as a result the split-gate trench MOSFET shown in FIG. 1 may not be suitable for many high voltage applications.

In one embodiment, a semiconductor device can include: (i) a substrate having a semiconductor material; (ii) a plurality of semiconductor layers of a first conductivity type, and being sequentially stacked on the substrate, where a doping concentration of the semiconductor layers successively increases from bottom to top; (iii) a trench that extends from the surface of a topmost semiconductor layer into a bottommost semiconductor layer of the semiconductor layers; (iv) a plurality of field plates that correspond to the semiconductor layers, each field plate being located in a portion of the trench that corresponds to one of the semiconductor layers; and (v) a trench pad located in a bottom and a sidewall of the trench, and being filled each space between two adjacent field plates, where the thickness of the trench pad between each field plate and corresponding semiconductor layer sequentially decreases from the bottom to the top.

Figure 2:
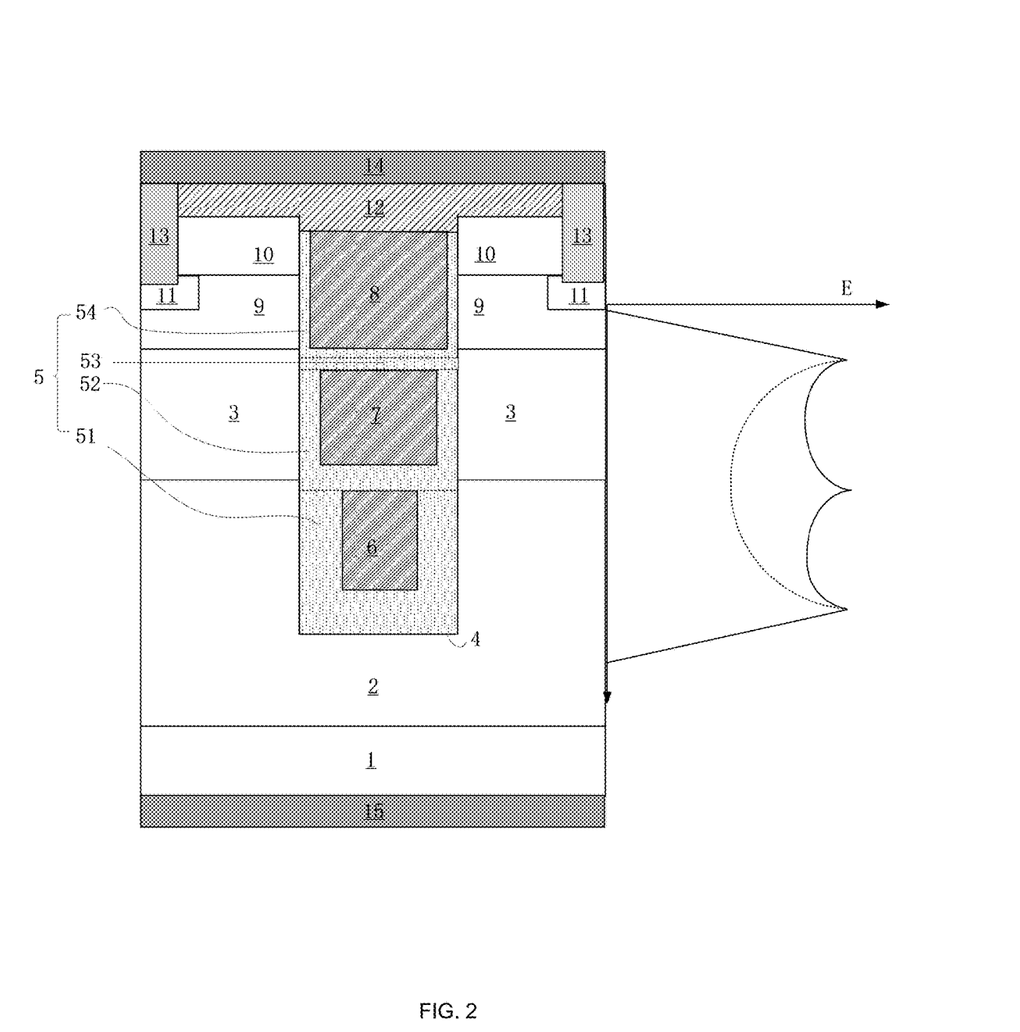
FIG. 2 is a cross-sectional diagram of an example semiconductor device, in accordance with embodiments of the present invention.

Referring now to FIG. 2 is a cross-sectional diagram of an example semiconductor device, in accordance with embodiments of the present invention. The semiconductor device in this particular example can include substrate 1, semiconductor layer 2, semiconductor layer 3, trench 4, trench pad 5, field plate 6, and field plate 7. For example, substrate 1 can be a semiconductor material, such as silicon. In addition, substrate 1 can be a silicon substrate with a first conductivity type. Semiconductor layers 2 and 3 may be sequentially stacked on substrate 1, and the doping concentration of semiconductor layer 2 may be less than that of semiconductor layer 3. Trench 4 can extend from the surface of semiconductor layer 3 into semiconductor layer 2. That is, a portion of trench 4 may be located in semiconductor layer 2, and a remaining portion can be located in semiconductor layer 3.

Field plate 6 may be located in the portion of trench 4 in semiconductor layer 2, and field plate 7 can be located in the remaining portion of trench 4 in semiconductor layer 3. Trench pad 5 may be located in the bottom and the sidewalls of trench 4 and can fill the space between field plate 6 and field plate 7. Accordingly, portion 51 of trench pad 5 may be located between field plate 6 and semiconductor layer 2, and portion 52 of trench pad 5 may be located between field plate 7 and semiconductor layer 3 and located between field plates 6 and 7. In addition, the thickness of trench pad 5 between field plate 6 and semiconductor layer 2 can be greater than that of trench pad 5 between field plate 7 and semiconductor layer 3.

In this particular example, the semiconductor device is a MOSFET device, and can further include gate 8, body region 9 with a second conductivity type, source region 10 with the first conductivity type, body contact region 11 with the second conductivity type, insulation layer 12, metal plug 13, source electrode 14, and drain electrode 15. Gate 8 can be located in trench 4 and above field plate 7. Portion 53 of trench pad 5 may be located on portion 52 of the trench pad and field plate 7. Portion 54 of trench pad 5 can include a first portion on portion 53 of trench pad 5, and a second portion between gate 8 and semiconductor layer 3. For example, portion 53 of trench pad 5 is an isolation dielectric layer of the semiconductor device, and portion 54 of trench pad 5 is a gate dielectric layer of the semiconductor device. In addition, the gate dielectric layer can be located on the isolation dielectric layer.

Body region 9 may be located in semiconductor layer 3, and separated by trench 4. Source region 10 can be located in body region 9 and separated by trench 4. Source electrode 14 can be coupled to source region 10. For example, insulation layer 12 may be disposed on source region 10 and gate 8. Also, source electrode 14 may be coupled to source region 10 by metal plug 13 passing through insulation layer 12. Metal plug 13 can further extend from source region 10 to body contact region 11 to couple source electrode 14 and body contact region 11. Source electrode 14 may also be coupled to field plates 6 and 7. In this example, both of semiconductor layers 2 and 3 can be epitaxial layers, and both of field plates 6 and 7 may be polysilicon field plates. Also in this example, the "first" conductivity type is N type, and the "second" conductivity type is P type, while in other examples, the first conductivity type can be P type, and the second conductivity type can be N type.

In the semiconductor device shown in FIG. 2, semiconductor layers 2 and 3 are both the drift region of the device. The doping concentration of semiconductor layer 2 located in the lower layer may be less than that of semiconductor layer 3 located in the upper layer. Also, the thickness of trench pad 5 between field plate 6 and the corresponding semiconductor layer 2 can be greater than that of trench pad 5 between field plate 7 and the corresponding semiconductor layer 3. As such, the thicker portion 51 of trench pad 5 and field plate 6 can deplete semiconductor layer 2 with the lower doping concentration, while the relatively thin portion 52 of trench pad 5 and field plate 7 can deplete semiconductor layer 3 with the higher doping concentration. In this way, the semiconductor device can increase the proportion of semiconductor layer 3 with a relatively low resistance.

An electric field diagram of the drift region is also shown in FIG. 2, where the solid line is the electric field diagram of the drift region of the semiconductor device. Because the semiconductor device of this particular example has the above characteristics, the electric field between field plates 6 and 7 may have a relatively sharp peak as shown. This can pull up the electric field of the drift region, and the dotted line is an electric field diagram of the drift region of the example semiconductor device shown in FIG. 1. In that case, the electric field may not form a sharp peak in the middle of the drift region, and can gradually decrease toward the middle of the drift region. As a result, the electric field of the drift region of the example semiconductor device of FIG. 2 is higher than that of semiconductor device shown in FIG. 1, while having the same drift region thickness. Thus, for cases whereby the semiconductor device of the example of FIG. 2 has the same breakdown voltage as that of semiconductor device FIG. 1, the thickness of the drift region and the on-resistance of the semiconductor device in the example of FIG. 2 can be greatly reduced relative to the structure of FIG. 1.

While the particular example of FIG. 2 only includes two semiconductor layers and corresponding field plates, other semiconductor devices in particular embodiments can include three or more semiconductor layers. For example, the plurality of semiconductor layers can be sequentially stacked on the substrate, and from bottom to top (e.g., the substrate toward the semiconductor layers), the doping concentration of the plurality of semiconductor layers can sequentially increase. Also, the trench may be formed from the surface of the topmost semiconductor layer, and can extend into of the bottommost semiconductor layer. Further, each of the semiconductor layers may have a corresponding field plate, and the space between the field plates may be filled with trench pads in the trench. The thickness of the trench pads between the plurality of field plates and corresponding semiconductor layers can sequentially decrease from the bottom of the trench upward. Further, each of the field plates can be coupled with a source electrode of the semiconductor device, such that each semiconductor layer is depleted by the field plates and trench pads located therein.

In certain embodiments, a plurality of semiconductor layers with increasing doping concentrations may be sequentially stacked successively on a substrate. The plurality of semiconductor layers can be configured as a drift region of the semiconductor device. Also, a plurality of field plates corresponding to the plurality of semiconductor layers may be disposed in the trench located in the drift region. The greater the doping concentration a semiconductor layer is, the thinner the trench pad between the field plates corresponding to the semiconductor layer and the semiconductor layer. Each semiconductor layer can be depleted by the corresponding field plate and the corresponding portion of the trench pad. Also, the on-resistance of the device can be drastically reduced, while a large breakdown voltage can be ensured, in order to accommodate high-voltage applications.

In one embodiment, a method of making a semiconductor device can include: (i) forming a first epitaxial layer with a first conductivity type on a substrate of semiconductor material; (ii) forming a second epitaxial layer with the first conductivity type on the first epitaxial layer, where the doping concentration of the first epitaxial layer is less than that of the second epitaxial layer; (iii) forming a trench extending from the surface of the second epitaxial layer into the first epitaxial layer; (iv) forming a trench pad in the trench; (v) disposing a first field plate in a portion of the trench located in the first epitaxial layer; and (vi) disposing a second field plate in a portion of the trench located in the second epitaxial layer, where the trench pad is located on a sidewall and a bottom of the trench and fills a space between the first and second field plates, and the thickness of the trench pad between the first field plate and the first epitaxial layer is greater than that of the trench pad between the second field plate and the second epitaxial layer.

Figure 3A:
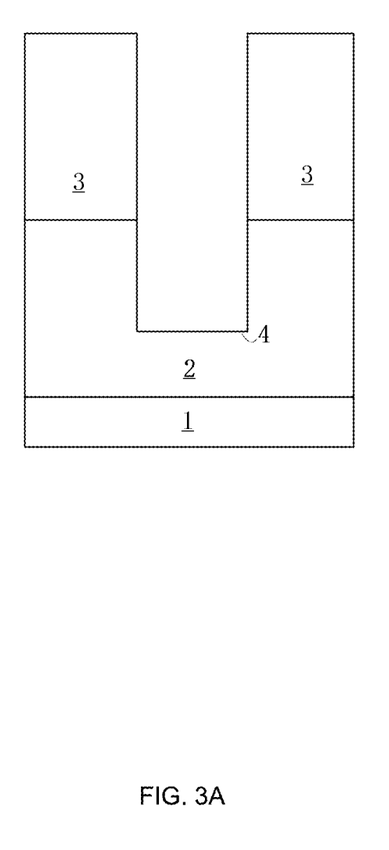
FIGS. 3A to 3I are cross-sectional diagrams of an example method of making a semiconductor device, in accordance with embodiments of the present invention.

Referring now to FIGS. 3A to 3I are cross-sectional diagrams of an example method of making a semiconductor device, in accordance with embodiments of the present invention. In FIG. 3A, epitaxial layer 2 with a first conductivity type can be formed on a substrate 1 including semiconductor material, and epitaxial layer 3 with a first conductivity type may be formed on epitaxial layer 2. The doping concentration of epitaxial layer 2 may be less than that of epitaxial layer 3. Substrate 1 can be a silicon substrate, and a doping concentration of which may generally be higher than the doping concentrations of epitaxial layers 2 and 3, in to reduce the on-resistance of the device. The first conductivity type is one of N type and P type, and the second conductivity type is the other one of N type and P type. In this example, trench 4 may be extend from the surface of epitaxial layer 3 into epitaxial layer 2. For example, trench 4 can be obtained by an etching process, and the etching may begin from the surface of epitaxial layer 3, and stop in epitaxial layer 2.

Figure 3B:
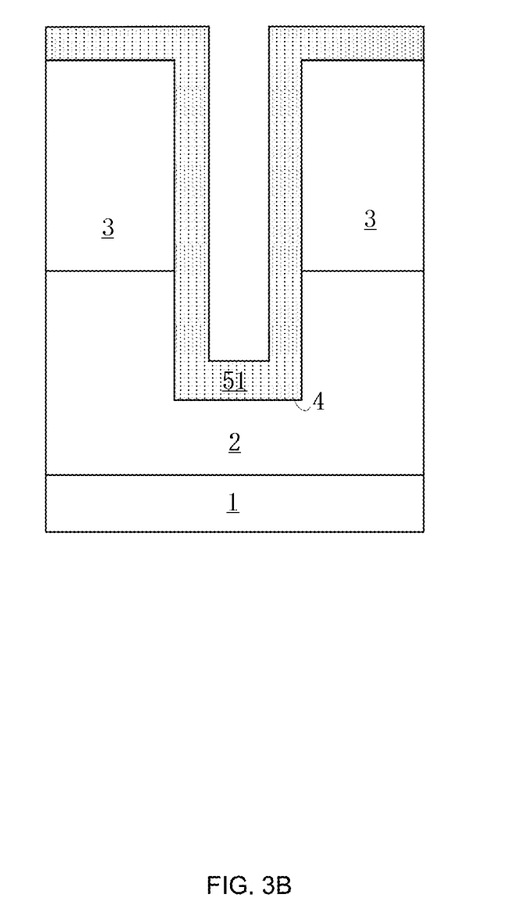

Referring now to FIGS. 3B-3E, a trench pad can be formed in trench 4, and field plate 6 may be disposed in a portion of trench 4 located in epitaxial layer 2. Field plate 7 can be disposed in the portion of trench 4 located in epitaxial layer 3, and the trench pad can be located on the sidewalls and the bottom of trench 4 and located between field plates 6 and 7. The thickness of the first portion of the trench pad between field plate 6 and epitaxial layer 2 may be greater than that of the second portion of the trench pad between field plate 7 and epitaxial layer 3. In FIG. 3B, oxide layer 51 having a first thickness may be deposited on the sidewalls and the bottom of trench 4.

Figure 3C:
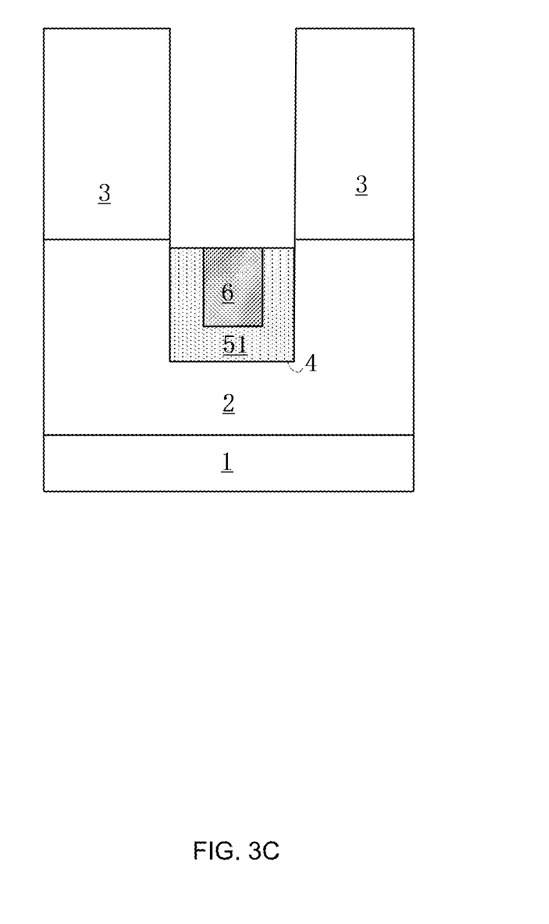
Figure 3D:
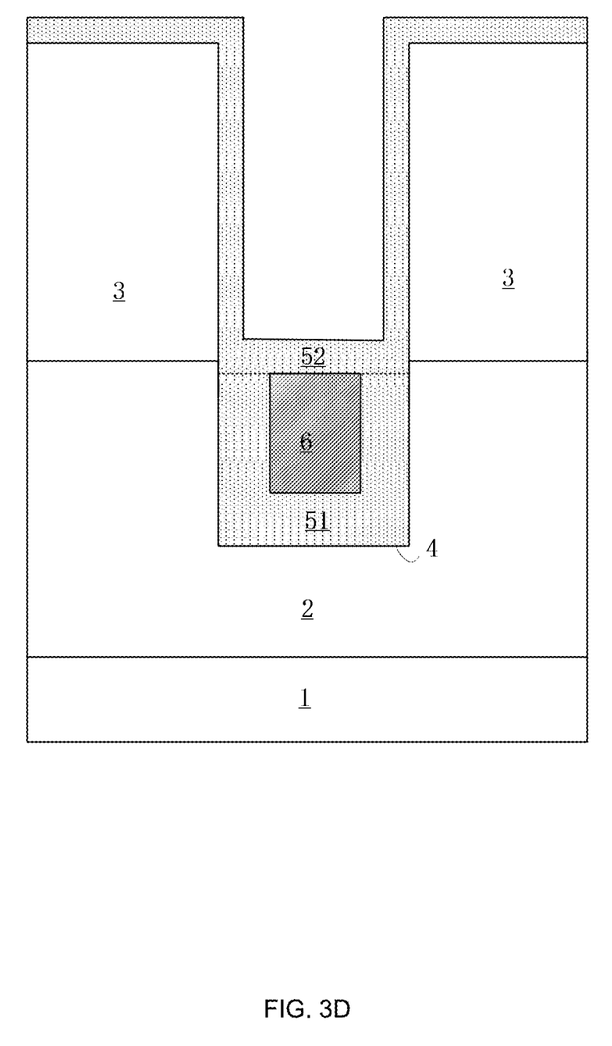
Figure 3E:
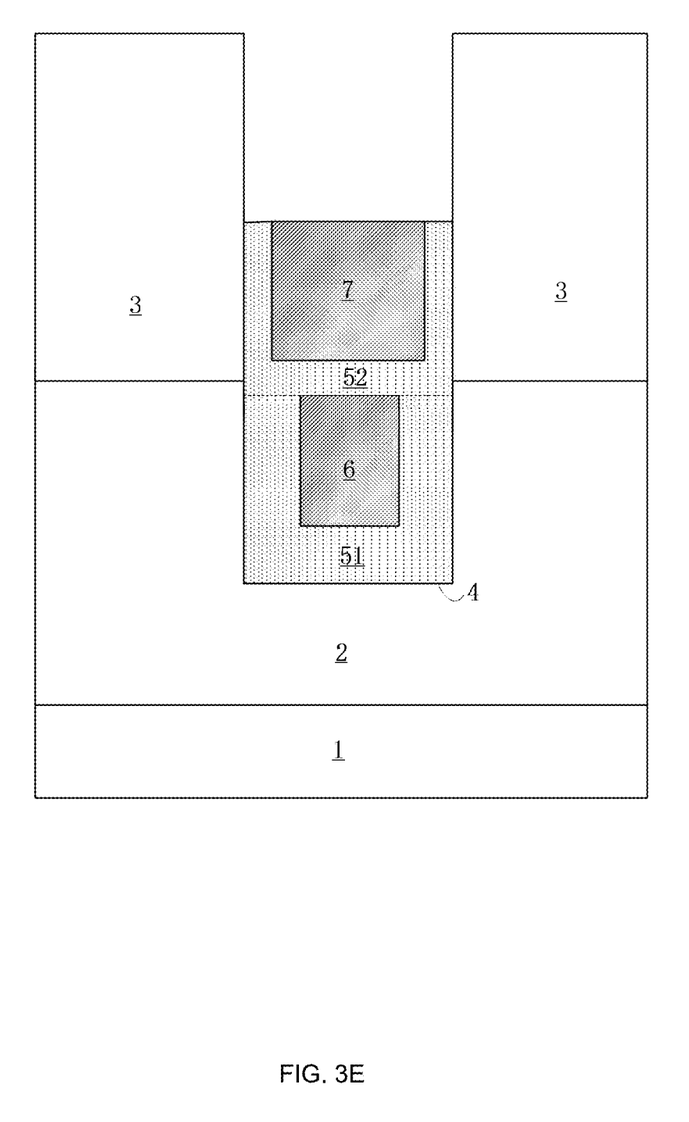

In FIG. 3C, a first polysilicon layer can be deposited in trench 4 having oxide layer 51. The first polysilicon layer and oxide layer 51 can be sequentially etched back, and the remaining first polysilicon layer can be field plate 6 and the remaining oxide layer 51 can be the first portion of the trench pad. In FIG. 3D, oxide layer 52 having a second thickness may be deposited on field plate 6, the first portion of the trench pad, and the sidewalls of trench 4. In FIG. 3E, a second polysilicon layer may be deposited in trench 4 having oxide layer 52. The second polysilicon layer and oxide layer 52 may be sequentially etched back. The remaining second polysilicon layer can be field plate 7 and the remaining oxide layer 52 may be the second portion of the trench pad.

Figure 3F:
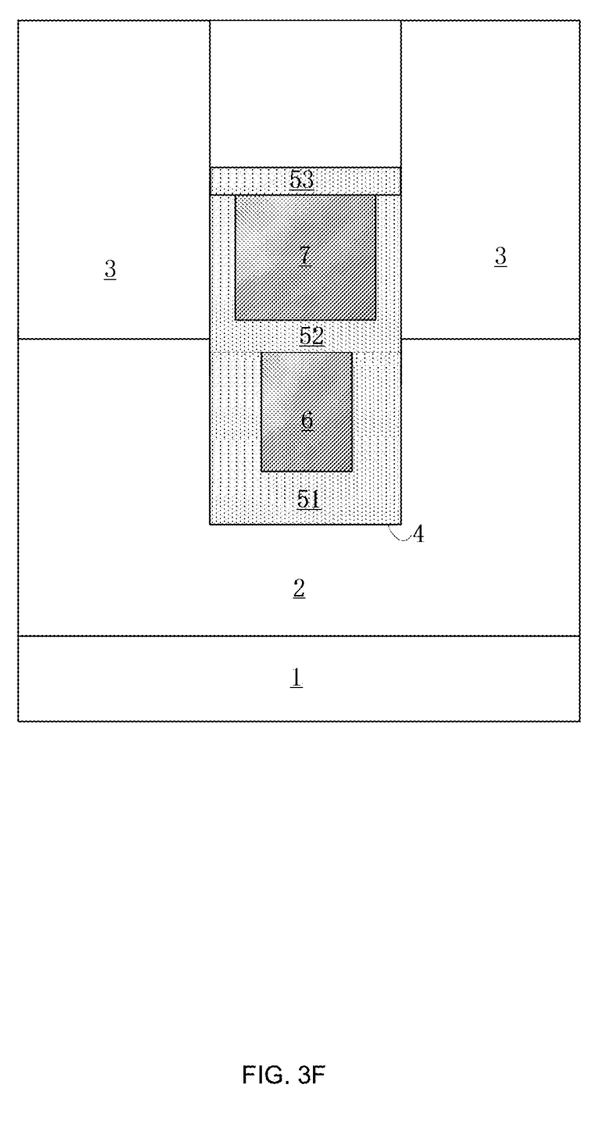

In FIG. 3F, oxide layer 53 can be deposited on field plate 7, the second portion of the trench pad, and the sidewalls of the trench until the entire trench 4 is filled by high-density plasma chemical vapor deposition (CVD). Then, oxide layer 53 may be polished and etched back through chemical mechanical planarization (CMP). The remaining oxide layer 53 can be an isolation dielectric layer between the gate and field plate 7, which may be the third portion of trench pad 5.

Figure 3G:
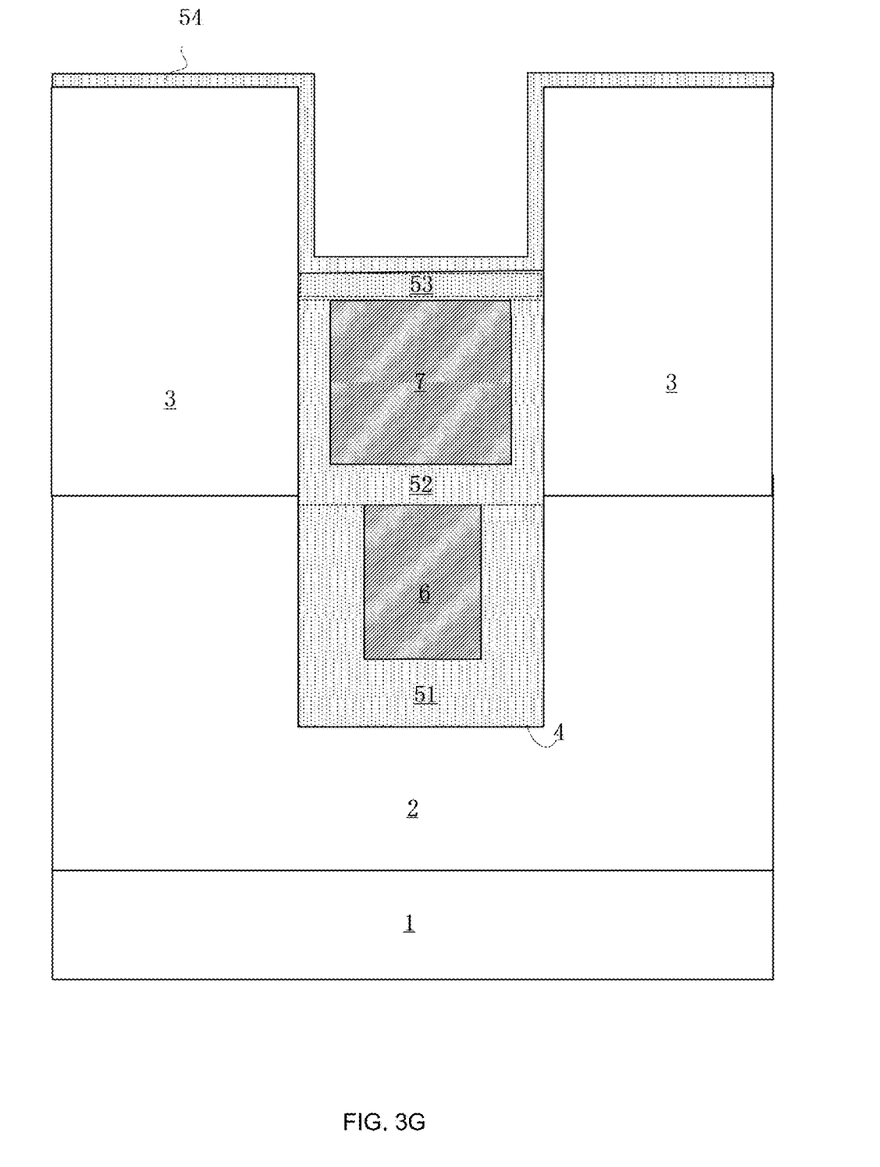
Figure 3H:
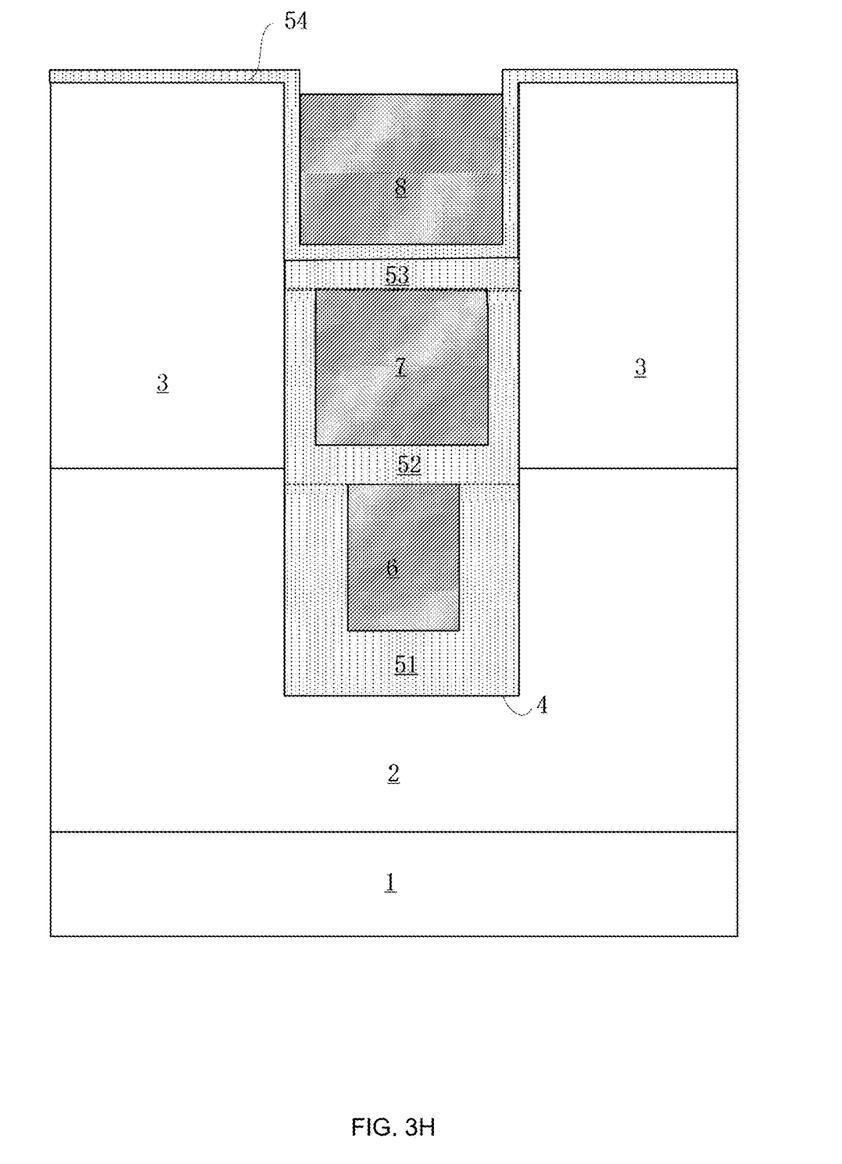

Referring now to FIGS. 3G and 3H, oxide layer 54 may be formed on the isolation dielectric layer, the sidewalls of trench 4, and the surface of semiconductor layer 3. A third polysilicon layer can be deposited on trench 4 having oxide layer 54. The third polysilicon layer can be etched back, and the remaining third polysilicon layer can be taken as gate 8 of the semiconductor device. Oxide layer 54 can be taken as the gate dielectric layer of the semiconductor device, and oxide layer 54 as the fourth portion of trench pad 5.

Figure 3I:
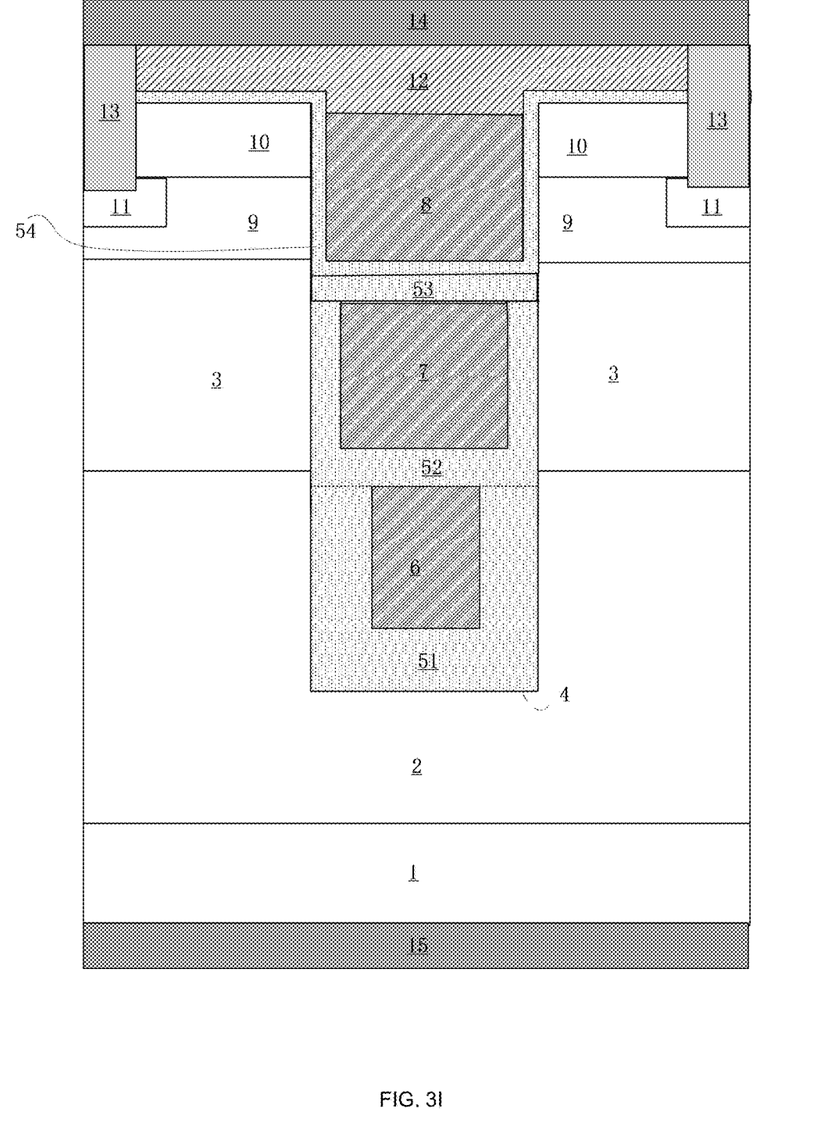

In FIG. 3I, body region 9 with a second conductivity type may be formed in epitaxial layer 3 located at both sides of trench 4, and source region 10 with a first conductivity type can be formed in body region 9 located at both sides of trench 4. Also, source electrode 14, which is coupled to source region 10, can be formed, and source electrode 14 also be coupled to field plates 6 and 7.

In order to achieve electrical connectivity between body region 9 and source region 10, insulation layer 12 can be formed on the source region 10 and gate 8. Then, insulating layer 12 may be subjected to an opening process to form body contact region 11 with the second conductivity type in body region 9. Also, metal plug 13 may be formed in the opening such that source electrode 14 is coupled to body contact region 11 and passes through metal plug 13. In addition, the back surface (e.g., the surface opposite to the stacked epitaxial layer) of substrate 1 can be thinned, and drain electrode 15 may be formed on the back surface.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:
1. A semiconductor device, comprising:
 a) a substrate having a semiconductor material;
 b) a plurality of semiconductor layers of a first conductivity type, and being sequentially stacked on said substrate, wherein a doping concentration of said plurality of semiconductor layers successively increases from bottom to top;
 c) a trench that extends from the surface of a topmost semiconductor layer into a bottommost semiconductor layer of said plurality of semiconductor layers;
 d) a plurality of field plates that correspond to said semiconductor layers, each field plate being located in a portion of said trench that corresponds to one of said plurality of semiconductor layers; and
 e) a trench pad located in a bottom and a sidewall of said trench, and filling each space between two adjacent field plates, wherein the thickness of said trench pad between each field plate and corresponding semiconductor layer sequentially decreases from the bottom to the top, and wherein an electric field peak occurs between two adjacent of said plurality of field plates.

2. The semiconductor device of claim 1, further comprising:
 a) a gate located on said plurality of field plates in said trench;
 b) a body region with a second conductivity type, wherein said body region is located in said topmost semiconductor layer of said plurality of semiconductor layers, and separated by said trench;
 c) a source region with a first conductivity type, wherein said source region is located in said body region and separated by said trench; and
 d) a source electrode coupled to said source region, wherein said trench pad between said gate and said topmost semiconductor layer of said plurality of semiconductor layers is configured as a gate dielectric layer and an isolation dielectric layer of said semiconductor device, and said gate dielectric layer is located on said isolation dielectric layer.

3. The semiconductor device of claim 2, wherein said source electrode is coupled to each of said plurality of field plates.

4. The semiconductor device of claim 3, further comprising:
 a) a body contact region with a second conductivity type located in said body region; and
 b) a metal plug that couples said source electrode to said body contact region.

5. The semiconductor device of claim 1, wherein each semiconductor layer is depleted by a corresponding of said field plates and trench pads located therein.

6. The semiconductor device of claim 1, wherein said electric field peak is configured to increase an electric field of a drift region that comprises said plurality of semiconductor layers, and to lower an on-resistance of said semiconductor device.

7. The semiconductor device of claim 1, wherein said plurality of field plates are configured as polysilicon field plates.

8. The semiconductor device of claim 1, wherein said plurality of semiconductor layers are configured as epitaxial layers.

9. A method of manufacturing a semiconductor device, the method comprising:
 a) forming a first epitaxial layer with a first conductivity type on a substrate of semiconductor material;
 b) forming a second epitaxial layer with the first conductivity type on said first epitaxial layer, wherein the doping concentration of said first epitaxial layer is less than that of said second epitaxial layer;
c) forming a trench extending from the surface of said second epitaxial layer into said first epitaxial layer;
d) forming a trench pad in said trench;
e) disposing a first field plate in a portion of said trench located in said first epitaxial layer; and
f) disposing a second field plate in a portion of said trench located in said second epitaxial layer, wherein said trench pad is located on a sidewall and a bottom of said trench and fills a space between said first and second field plates, and the thickness of the trench pad between said first field plate and said first epitaxial layer is greater than that of the trench pad between said second field plate and said second epitaxial layer, wherein an electric field peak occurs between said first and second field plates.

10. The method of claim 9, further comprising:
a) forming a first oxide layer having a first thickness on a sidewall and a bottom of said trench;
b) depositing a first polysilicon layer in said trench having said first oxide layer;
c) etching said first polysilicon layer and said first oxide layer, wherein the remaining said first polysilicon layer is configured as said first field plate, and the remaining said first oxide layer is configured as a first portion of said trench pad;
d) depositing a second oxide layer having a second thickness on said first field plate, the first portion of said trench pad, and the sidewalls of said trench;
e) depositing a second polysilicon layer in said trench having said second oxide layer; and
f) etching said second polysilicon layer and said second oxide layer, wherein the remaining said second polysilicon is configured as said second field plate, and the remaining said second oxide layer is configured as a second portion of said trench pad.

11. The method of claim 10, further comprising:
a) depositing a third oxide layer on said second portion of said trench pad, said second field plate, and the sidewalls of said trench;
b) forming an isolation dielectric layer by chemical mechanical polishing and etching;
c) forming a fourth oxide layer on said isolation dielectric layer and the sidewalls of said trench;
d) depositing a third polysilicon layer in said trench with said fourth oxide layer; and
e) etching back said third polysilicon layer, wherein the remaining said third polysilicon layer is configured as a gate of said semiconductor device, and said fourth oxide layer is configured as a gate dielectric layer of said semiconductor device.

12. The method of claim 11, further comprising:
a) forming a body region with a second conductivity type in said second epitaxial layer located at both sides of said trench;
b) forming a source region with a first conductivity type in said body region located at both sides of said trench; and
c) forming a source electrode coupled to said source region and said first and second field plates.

13. The method of claim 12, further comprising:
a) forming a body contact region in said body region between formation of said source region and said source electrode; and
b) using a metal plug to couple said source electrode to said body contact region.

* * * * *